(12) United States Patent
Shimizu

(10) Patent No.: US 8,818,304 B2
(45) Date of Patent: Aug. 26, 2014

(54) TRANSMITTER WITH CLASS E AMPLIFIER

(75) Inventor: Yutaka Shimizu, Kanagawa-ken (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 63 days.

(21) Appl. No.: 13/227,069

(22) Filed: Sep. 7, 2011

(65) Prior Publication Data
US 2012/0214433 A1 Aug. 23, 2012

(30) Foreign Application Priority Data

Feb. 17, 2011 (JP) .................................. 2011-031558

(51) Int. Cl.
*H04B 1/04* (2006.01)
(52) U.S. Cl.
USPC .......................... 455/126; 455/127.2; 330/250
(58) Field of Classification Search
USPC .................... 455/91, 127; 375/295, 261, 298; 332/115
See application file for complete search history.

(56) References Cited

U.S. PATENT DOCUMENTS

| | | | | |
|---|---|---|---|---|
| 5,367,271 | A * | 11/1994 | Yamamoto et al. | 332/105 |
| 5,535,438 | A | 7/1996 | Sevic | |
| 6,218,904 | B1 | 4/2001 | Panther | |
| 7,460,612 | B2 * | 12/2008 | Eliezer et al. | 375/295 |
| 7,532,679 | B2 * | 5/2009 | Staszewski et al. | 375/295 |
| 7,667,511 | B2 * | 2/2010 | Staszewski et al. | 327/172 |
| 2002/0180547 | A1 | 12/2002 | Staszewski et al. | |
| 2004/0002320 | A1 * | 1/2004 | Lin | 455/318 |
| 2005/0088242 | A1 | 4/2005 | Behzad | |
| 2005/0287967 | A1 * | 12/2005 | Hung et al. | 455/127.2 |
| 2006/0038710 | A1 * | 2/2006 | Staszewski et al. | 341/143 |
| 2006/0217086 | A1 * | 9/2006 | Mekechuk et al. | 455/126 |
| 2006/0217087 | A1 * | 9/2006 | Snelgrove et al. | 455/126 |
| 2006/0291589 | A1 * | 12/2006 | Eliezer et al. | 375/302 |
| 2007/0129030 | A1 * | 6/2007 | Litmanen et al. | 455/127.1 |
| 2010/0164568 | A1 | 7/2010 | Choi et al. | |

(Continued)

FOREIGN PATENT DOCUMENTS

| | | |
|---|---|---|
| JP | 2003060525 A | 2/2003 |
| JP | 2006-245967 | 9/2006 |
| JP | 2010-206300 A | 9/2010 |
| JP | 2010206300 A | 9/2010 |

OTHER PUBLICATIONS

A. Telegdy, et al., "Class-EM Switching-Mode Tuned Power Amplifier High Efficiency With Slow-Switching Transistor", IEEE Transactions on Microwave and Techniques, USA, IEEE, Jun. 2003, vol. 51, No. 6, pp. 1662-1676.

(Continued)

*Primary Examiner* — Temesgh Ghebretinsae
*Assistant Examiner* — Richard Chan
(74) *Attorney, Agent, or Firm* — White & Case LLP

(57) ABSTRACT

According to one embodiment, a transmitter includes a first buffer, a second buffer, a logic circuit, and a class E power amplifier. The first buffer receives a first sinusoidal signal, and converts the first sinusoidal signal to a first rectangular wave signal. The second buffer receives a second sinusoidal signal having a phase delay with respect to the first sinusoidal signal, and converts the second sinusoidal signal to a second rectangular wave signal. The logic circuit receives the first and second rectangular wave signals, and performs logical operation processing on the first and second rectangular wave signals to generate a logic signal with a predetermined duty cycle. The class E power amplifier receives the logic signal, and performs amplification operation based on the logic signal.

4 Claims, 15 Drawing Sheets

(56) References Cited

U.S. PATENT DOCUMENTS

2010/0173597 A1* 7/2010 Behzad ................. 455/127.1
2011/0181364 A1* 7/2011 Ahadian et al. ............. 330/290
2012/0064836 A1* 3/2012 Bauwelinck et al. .......... 455/73
2012/0214433 A1* 8/2012 Shimizu ................. 455/127.2

OTHER PUBLICATIONS

Japanese Office Action issued in corresponding JP Application No. 2011-031558 on Jul. 31, 2013, along with English translation thereof.

Taiwanese Office Action issued in corresponding TW Application No. 100129577 on Sep. 16, 2013, along with English translation thereof.

Japanese Office Action received in corresponding Japanese Application No. 2011-031558 dated Jan. 8, 2014, and an English translation thereof.

Chinese Office Action received in corresponding Chinese Application No. 2011-102542523 dated May 22, 2014, and an English translation thereof.

* cited by examiner

US 8,818,304 B2

TRANSMITTER WITH CLASS E AMPLIFIER

CROSS REFERENCE TO RELATED APPLICATION

This application is based upon and claims the benefit of priority from the prior Japanese Patent Application No. 2011-31558, filed on Feb. 17, 2011, the entire contents of which are incorporated herein by reference.

FIELD

Embodiments described herein relate to a transmitter with a class E amplifier.

BACKGROUND

With the reduction in dimensions and the increase in frequency and integration density of MOS transistors, power amplifiers constructed using MOS transistors are rapidly increasing. In radio systems and the like in which a reduction in power consumption is required, transmitters with class C amplifiers having excellent power efficiency are frequently used.

Class C amplifiers have the problem that the power efficiency and output power are influenced by threshold shifts of MOS transistors. Moreover, there is the problem that a shift in characteristics of the MOS transistors causes a shift in operating states of transistors in an output stage to deteriorate the reliability of a transmitter.

DETAILED DESCRIPTION

Figure 1:
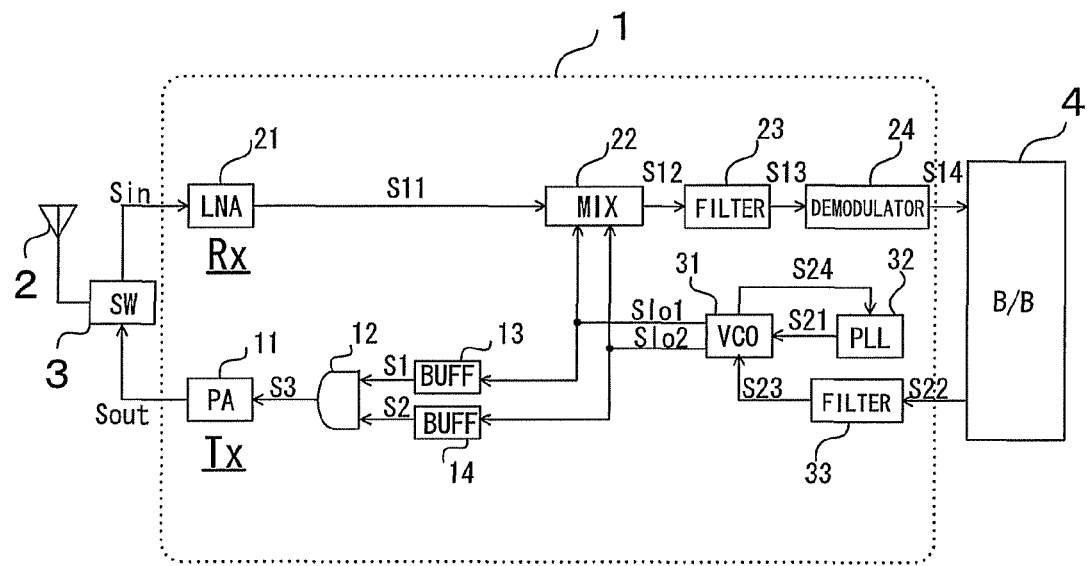
FIG. 1 is a block diagram showing a transceiver according to a first embodiment.

According to one embodiment, a transmitter includes a first buffer, a second buffer, a logic circuit, and a class E power amplifier. The first buffer receives a first sinusoidal signal, and converts the first sinusoidal signal to a first rectangular wave signal. The second buffer receives a second sinusoidal signal having a phase delay with respect to the first sinusoidal signal, and converts the second sinusoidal signal to a second rectangular wave signal. The logic circuit receives the first and second rectangular wave signals, and performs logical operation processing on the first and second rectangular wave signals to generate a logic signal with a predetermined duty cycle. The class E power amplifier receives the logic signal, and performs amplification operation based on the logic signal.

Hereinafter, further plural examples are described with reference to the drawings. In the drawings, the same reference numerals denote the same or similar portions.

Figure 2:
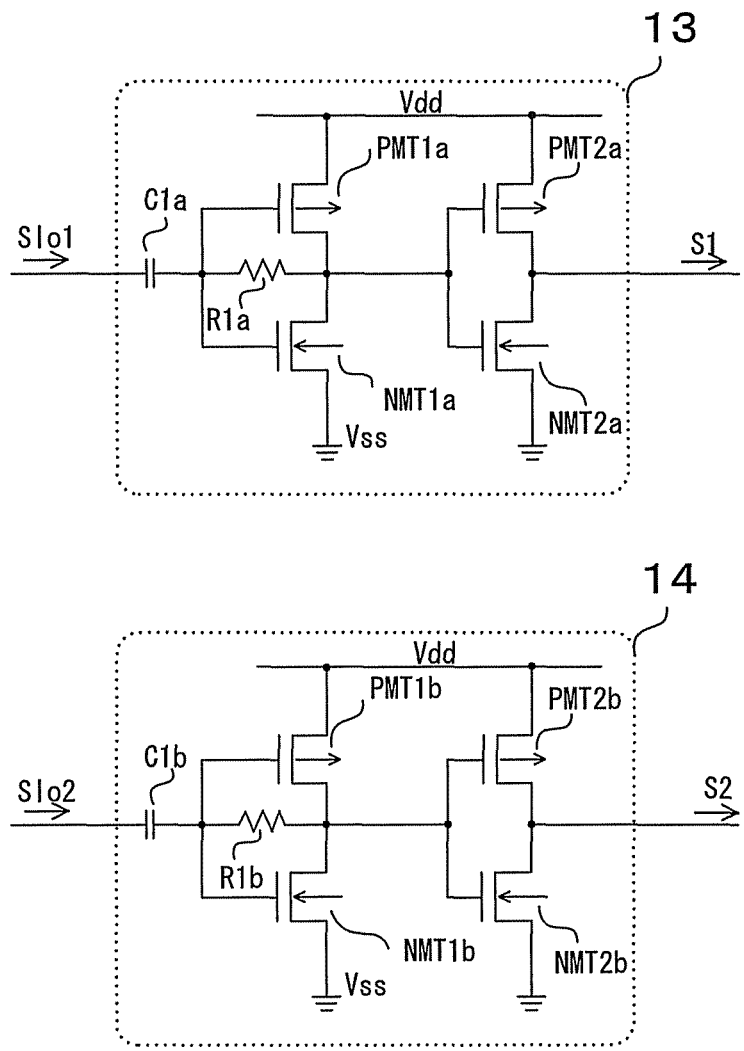
FIG. 2 is a circuit diagram showing buffers according to the first embodiment.
Figure 3:
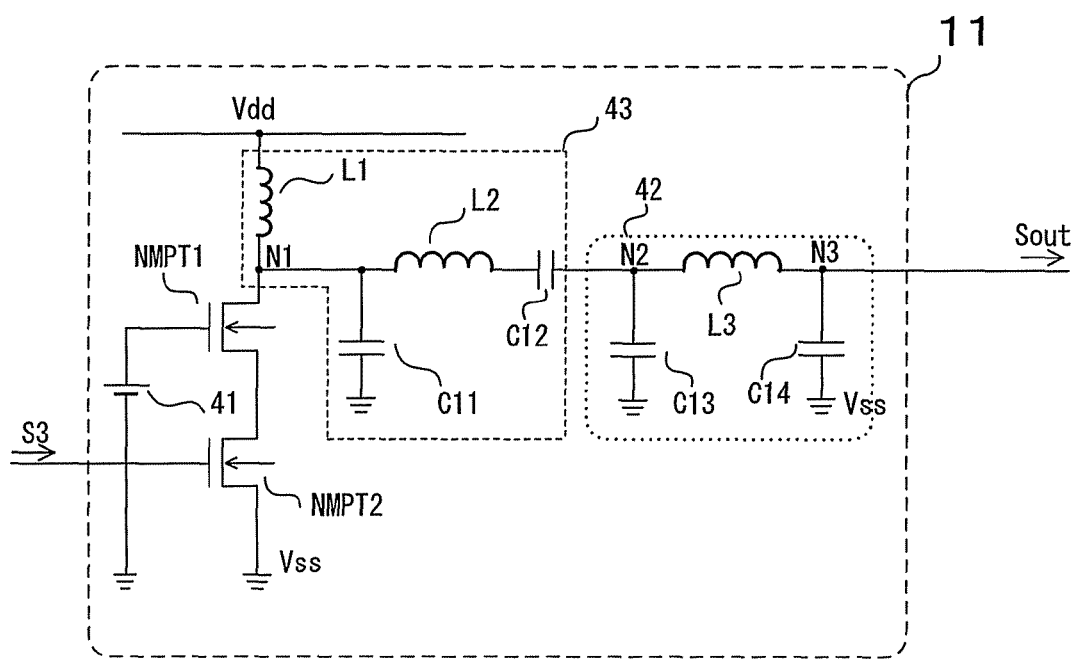
FIG. 3 is a circuit diagram showing a power amplifier according to the first embodiment.

A transmitter according to a first embodiment will be described with reference to the drawings. FIG. 1 is a block diagram showing the transceiver. FIG. 2 is a circuit diagram showing buffers. FIG. 3 is a circuit diagram showing a power amplifier. In the embodiment, a logic signal with a duty cycle of 25% is inputted to a class E amplifier.

As shown in FIG. 1, a transceiver 1 includes a power amplifier 11, a two-input AND circuit 12, a buffer 13, a buffer 14, a low-noise amplifier 21, a mixer 22, a filter 23, a demodulator 24, a voltage controlled oscillator 31, a PLL circuit 32, and a filter 33.

The transceiver 1 is an RF transceiver. In a reception system of the transceiver 1, a signal received by an antenna 2 is inputted to the low-noise amplifier 21 through a switch 3 as an input signal Sin. The transceiver 1 outputs a signal S14, which is a baseband signal demodulated by the demodulator 24, to a baseband unit 4. In the transceiver 1, a signal S22, which is a baseband signal outputted from the baseband unit 4, is inputted to the filter 33. In a transmission system of the transceiver 1, an output signal Sout outputted from the power amplifier 11 is outputted to the antenna 2 through the switch 3.

The filter 33 receives the signal S22, and outputs a signal S23 as a modulating signal obtained by band-limiting the signal S22 to the voltage controlled oscillator 31. The PLL circuit 32 outputs a signal S21, which is a control signal to maintain a constant frequency, to the voltage controlled oscillator 31. The voltage controlled oscillator 31 receives the signals S21, S23, and generates a local oscillation signal Slo1 and a local oscillation signal Slo2 having a 90° (λ/4) phase delay with respect to the local oscillation signal Slo1 based on the signals S21, S23. A signal S24 outputted from the voltage controlled oscillator 31 is feedback-inputted to the PLL circuit 32. The local oscillation signals Slo1, Slo2 are inputted to the mixer 22. The local oscillation signal Slo1 is inputted to the buffer 13. The local oscillation signal Slo2 is inputted to the buffer 14.

The low-noise amplifier 21 receives the input signal Sin, and generates a signal S11 obtained by amplifying the input signal Sin. The mixer 22 receives the signal S11 and the local oscillation signals Slo1, Slo2, and outputs an image-suppressed signal S12 to the filter 23. The filter 23 receives the signal S12, and outputs a signal S13 obtained by passing only frequency components of the signal S12 in a predetermined band to the demodulator 24.

The buffer 13 is provided between the voltage controlled oscillator 31 and the two-input AND circuit 12. The buffer 13 receives the local oscillation signal Slo1, which is a sinusoidal signal, converts the local oscillation signal Slo1 to a signal S1, which is a rectangular wave signal, and outputs the signal S1 to the two-input AND circuit 12. The buffer 14 is provided between the voltage controlled oscillator 31 and the two-input AND circuit 12. The buffer 14 receives the local oscillation signal Slo2, which is a sinusoidal signal, converts the local oscillation signal Slo2 to a signal S2, which is a rectangular wave signal, and outputs the signal S2 to the two-input AND circuit 12.

As shown in FIG. 2, the buffer 13 includes a capacitor C1a, a resistor R1a, a P-channel MOS transistor PMT1a, a P-channel MOS transistor PMT2a, an N-channel MOS transistor NMT1a, and an N-channel MOS transistor NMT2a. The buffer 14 includes a capacitor C1b, a resistor R1b, a P-channel MOS transistor PMT1b, a P-channel MOS transistor PMT2b, an N-channel MOS transistor NMT1b, and an N-channel MOS transistor NMT2b.

Since the buffers 13, 14 have the same circuit configuration, elements of the buffer 13 will be described as representatives, and elements of the buffer 14 will not be further described.

The capacitor C1a has one end receiving the local oscillation signal Slo1. The P-channel MOS transistor PMT1a has a source connected to a higher voltage source Vdd, and has a gate connected to other end of the capacitor C1a. The resistor R1a has one end connected to the other end of the capacitor C1a, and has other end connected to a drain of the P-channel MOS transistor PMT1a. The N-channel MOS transistor NMT1a has a drain connected to the drain of the P-channel MOS transistor PMT1a, has a gate connected to the other end of the capacitor C1a, and has a source connected to a lower voltage source (ground potential) Vss. The P-channel MOS transistor PMT2a has a source connected to the higher voltage source Vdd, and has a gate connected to the drain of the P-channel MOS transistor PMT1a. The N-channel MOS transistor NMT2a has a drain connected to a drain of the P-channel MOS transistor PMT2a, has a gate connected to the drain of the P-channel MOS transistor PMT1a, and has a source connected to the lower voltage source (ground potential) Vss. The signal S1 is outputted from the drain side of the P-channel MOS transistor PMT2a.

The two-input AND circuit 12 is provided between the buffers 13, 14 and the power amplifier 11. The two-input AND circuit 12 receives the signals S1, S2, performs logical operation processing on the signals S1, S2 to generate a signal S3, which is a logic signal with a duty cycle of 25%, and outputs the signal S3 to the power amplifier 11.

The power amplifier 11 is a class E power amplifier in which transistors are intended to operate as switches. The power amplifier 11 is provided between the two-input AND circuit 12 and the switch 3. The power amplifier 11 receives the signal S3 with a duty cycle of 25%, performs amplification operation based on the signal S3 to generate the output signal Sout, and outputs the output signal Sout to the switch 3.

As shown in FIG. 3, the power amplifier 11 includes a voltage bias circuit 41, a filter circuit 42, an output matching circuit 43, an N-channel MOS transistor NMPT1, and an N-channel MOS transistor NMPT2.

The power amplifier 11 is a cascode-connected power amplifier. The N-channel MOS transistors NMPT1, NMPT2 are cascode-connected. The N-channel MOS transistors NMPT1, NMPT2 are enhancement-mode transistors.

The output matching circuit 43 includes an inductor L1, an inductor L2, a capacitor C11, and a capacitor C12.

The inductor L1 has one end connected to the higher voltage source Vdd, and has other end connected to a node N1. The voltage bias circuit 41 supplies a gate of the N-channel MOS transistor NMPT1 with a predetermined voltage. The capacitor C11 has one end connected to the node N1, and has other end connected to the lower voltage source (ground potential) Vss. The inductor L2 has one end connected to the node N1. The capacitor C12 has one end connected to other end of the inductor L2, and has other end connected to a node N2.

The N-channel MOS transistor NMPT1 has a drain connected to the node N1, and has the gate to which the voltage outputted from the voltage bias circuit 41 is applied. The N-channel MOS transistor NMPT1 is turned on when the voltage outputted from the voltage bias circuit 41 is applied, and functions as a load. The N-channel MOS transistor NMPT2 has a drain connected to a source of the N-channel MOS transistor NMPT1, has a gate receiving the signal S3, and has a source connected to the lower voltage source (ground potential) Vss. The N-channel MOS transistor NMPT2 is a transistor in the output stage which is turned on or off based on the signal S3.

The N-channel MOS transistor NMPT2 performs amplification operation at high frequencies. Thus, the size of the gate length (Lg) of the N-channel MOS transistor NMPT2 is set smaller than that of the N-channel MOS transistor NMPT1. For example, the gate length Lg of the N-channel MOS transistor NMPT2 is set to 0.1 μm, and the gate length Lg of the N-channel MOS transistor NMPT1 is set to 0.6 μm.

The filter circuit 42 includes an inductor L3, a capacitor C13, and a capacitor C14. The filter circuit 42 attenuates harmonic content.

The capacitor C13 has one end connected to the node N2, and has other end connected to the lower voltage source (ground potential) Vss. The inductor L3 has one end connected to the node N2, and has other end connected to a node N3. The capacitor C14 has one end connected to the node N3, and has other end connected to the lower voltage source (ground potential) Vss. The output signal Sout is outputted from the node N3 side.

Figure 4:
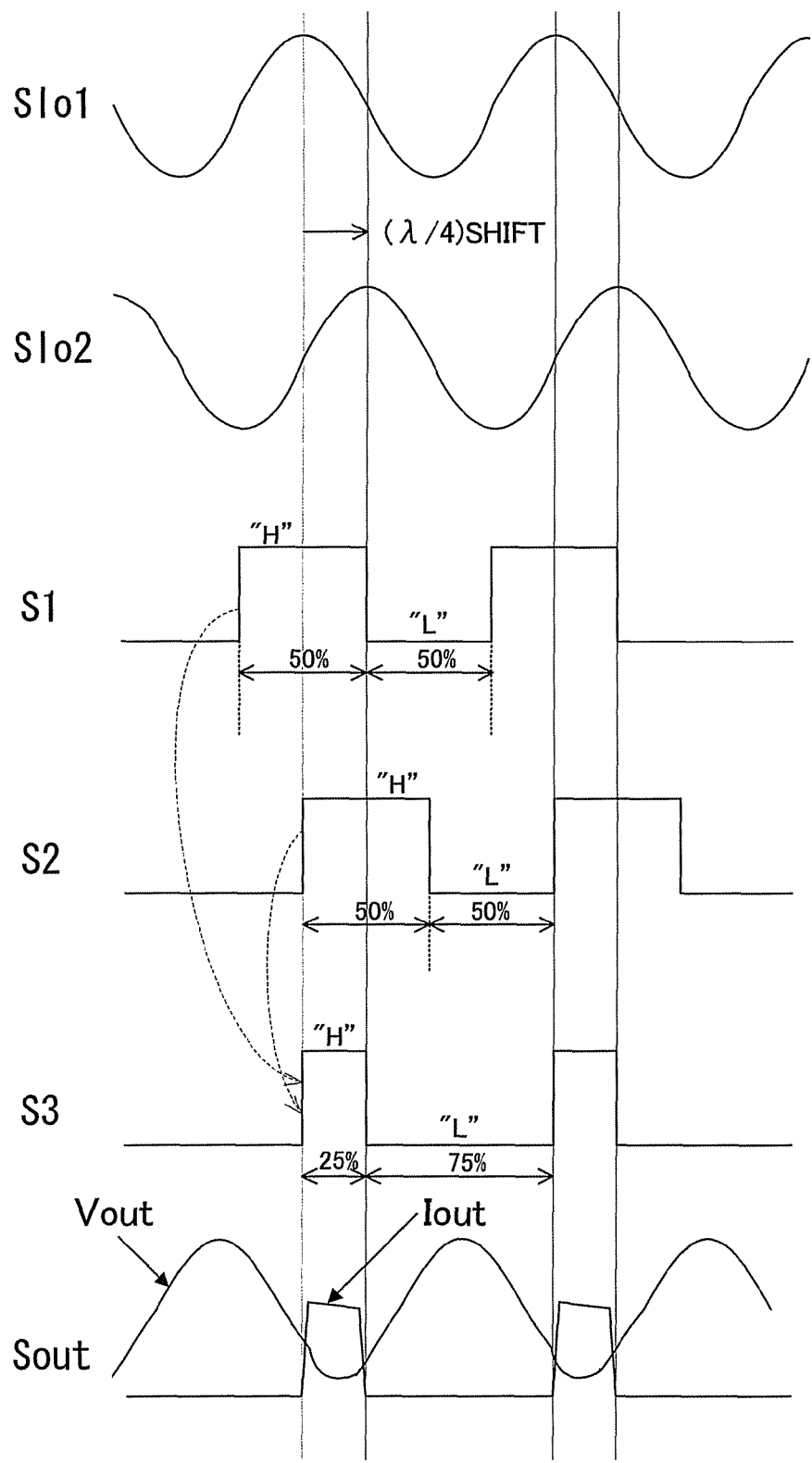
FIG. 4 is a view to explain operations of the power amplifier according to the first embodiment.

Next, characteristics and operations of the class E power amplifier will be described with reference to FIGS. 4 to 8. FIG. 4 is a view to explain operations of the power amplifier.

As shown in FIG. 4, the local oscillation signal Slo1 is outputted from the voltage controlled oscillator 31 to be inputted to the buffer 13. The local oscillation signal Slo1 is converted to the signal S1, which is a rectangular wave signal, by the buffer 13. The signal S1 is a signal which contains 50% high level intervals and 50% low level intervals. The local oscillation signal Slo2 has a 90° (λ/4) phase delay with respect to the local oscillation signal Slo1, and is outputted from the voltage controlled oscillator 31 to be inputted to the buffer 14. The local oscillation signal Slo2 is converted to the signal S2, which is a rectangular wave signal, by the buffer 14. The signal S2 is a signal which contains 50% high level intervals and 50% low level intervals.

The signals S1, S2 are inputted to the two-input AND circuit 12. The two-input AND circuit 12 performs logical operation processing on the signals S1, S2 to generate the signal S3. The signal S3 is a logic signal with a duty cycle of 25% which contains 25% high level intervals and 75% low level intervals.

The signal S3 is inputted to the class E power amplifier 11. The class E power amplifier 11 turns current on or off based on the signal S3, and outputs the output signal Sout, which is an amplified signal. The class E power amplifier 11 is turned on in high level intervals of the signal S3 to generate an output current Iout and an output voltage Vout having a constant output amplitude.

Figure 5:
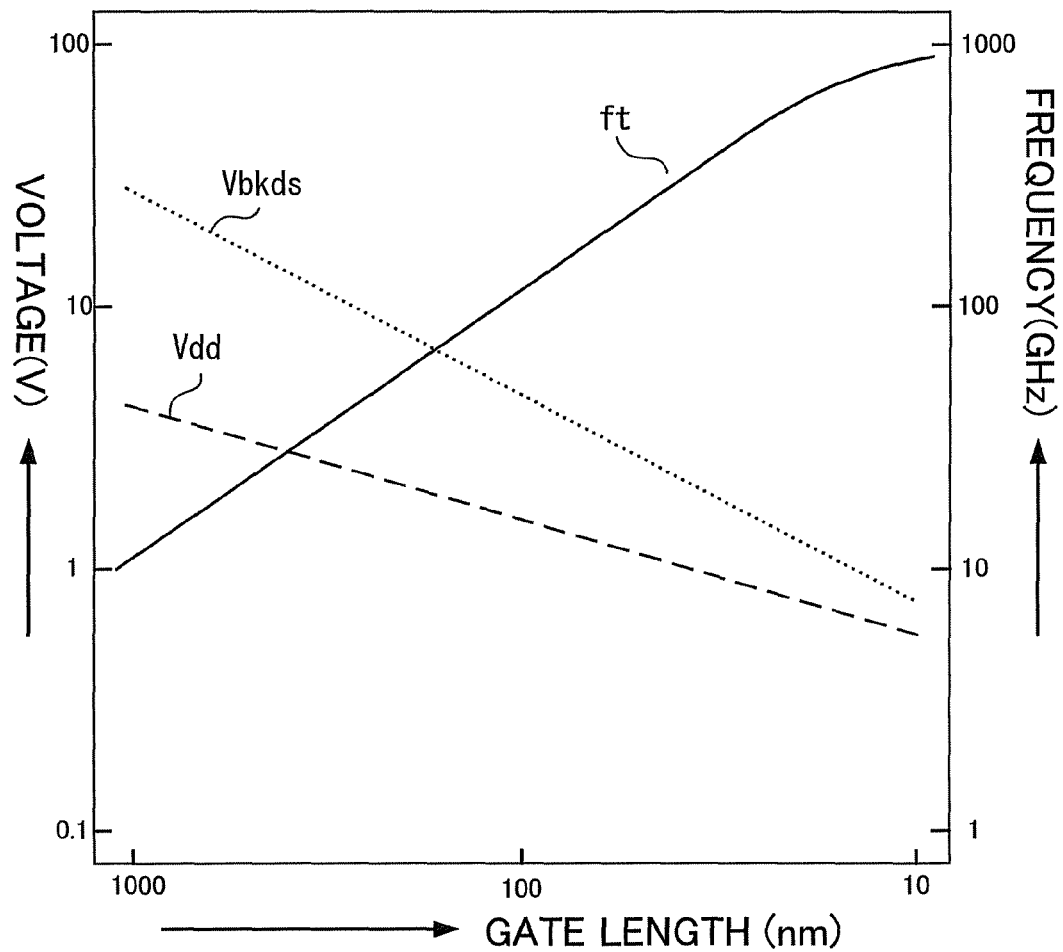
FIG. 5 is a view to explain characteristics of a MOS transistor used in the power amplifier according to the first embodiment.

FIG. 5 is a view to explain characteristics of a MOS transistor used in the power amplifier.

As shown in FIG. 5, in a MOS transistor used as an output-stage transistor of the power amplifier, ft (cutoff frequency) linearly increases with decreasing size of the gate length (Lg). In a region in which the size of the gate length (Lg) is not more than 50 nm, the rate of increase decreases due to the influence of the source resistance. On the other hand, Vbkds (drain-source breakdown voltage) and the higher voltage source voltage Vdd linearly decreases with decreasing size of the gate length (Lg). It should be noted that Vbkds>Vdd.

Figure 6:
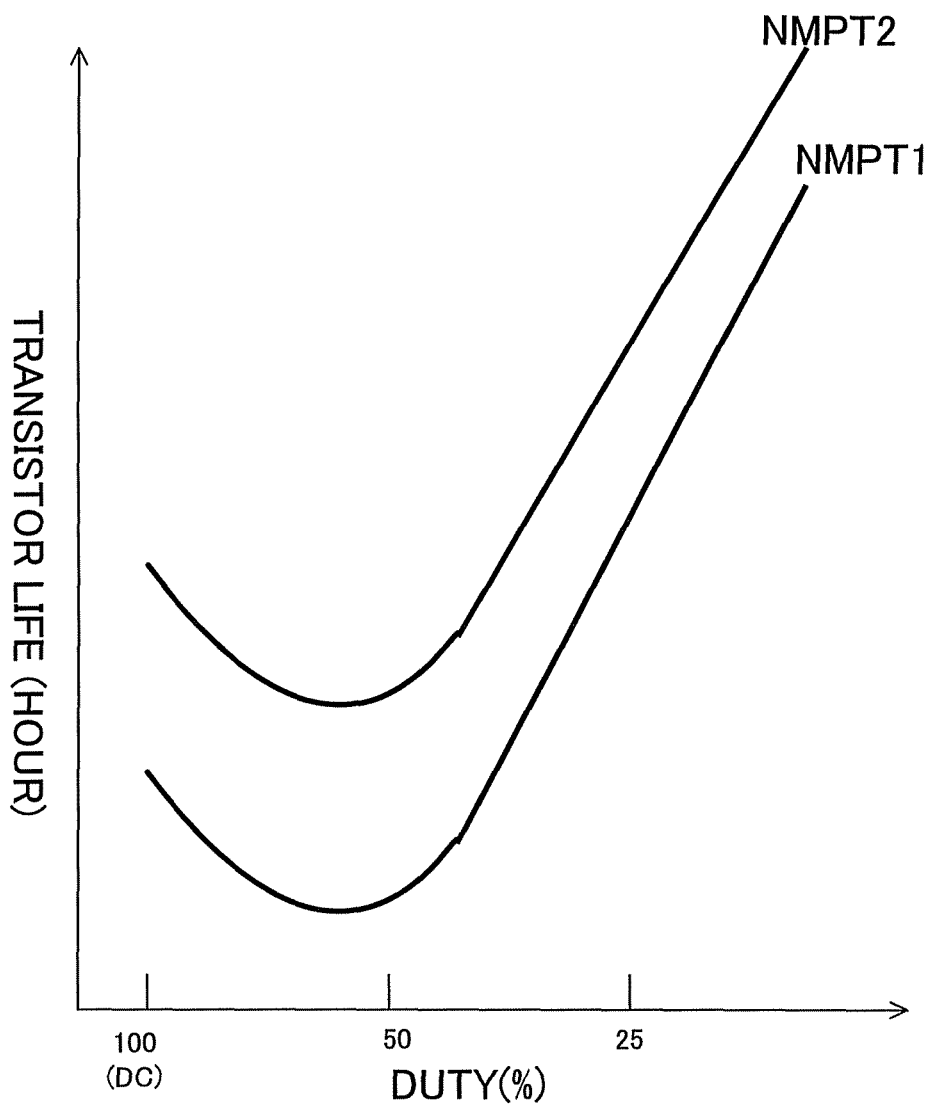
FIG. 6 is a view to explain the life of MOS transistors used in the power amplifier according to the first embodiment.

FIG. 6 is a view to explain the life of MOS transistors used for the power amplifier. The life of the N-channel MOS transistors NMPT1, NMPT2 included in the class E power amplifier 11 is mainly determined by the average value and amplitude of the drain-source voltage and the duty cycle of the drain current. The life decreases with increasing output power and increasing duty cycle of the current. The size of the gate length (Lg) of the N-channel MOS transistor NMPT2 is set smaller than that of the N-channel MOS transistor NMPT1. However, since the drain-source voltage of the N-channel MOS transistor NMPT2 is set to a relatively small value, the life of the N-channel MOS transistor NMPT2 is longer than that of the N-channel MOS transistor NMPT1. It can be seen that in a generally-used region in which the duty cycle is not more than 50%, with decreasing duty cycle of the signal S3, which is a logic signal inputted to the class E power amplifier 11, a deterioration in characteristics of the transistors included in the class E power amplifier 11 can be reduced, and the reliability of the class E power amplifier 11 can be improved.

Figure 7:
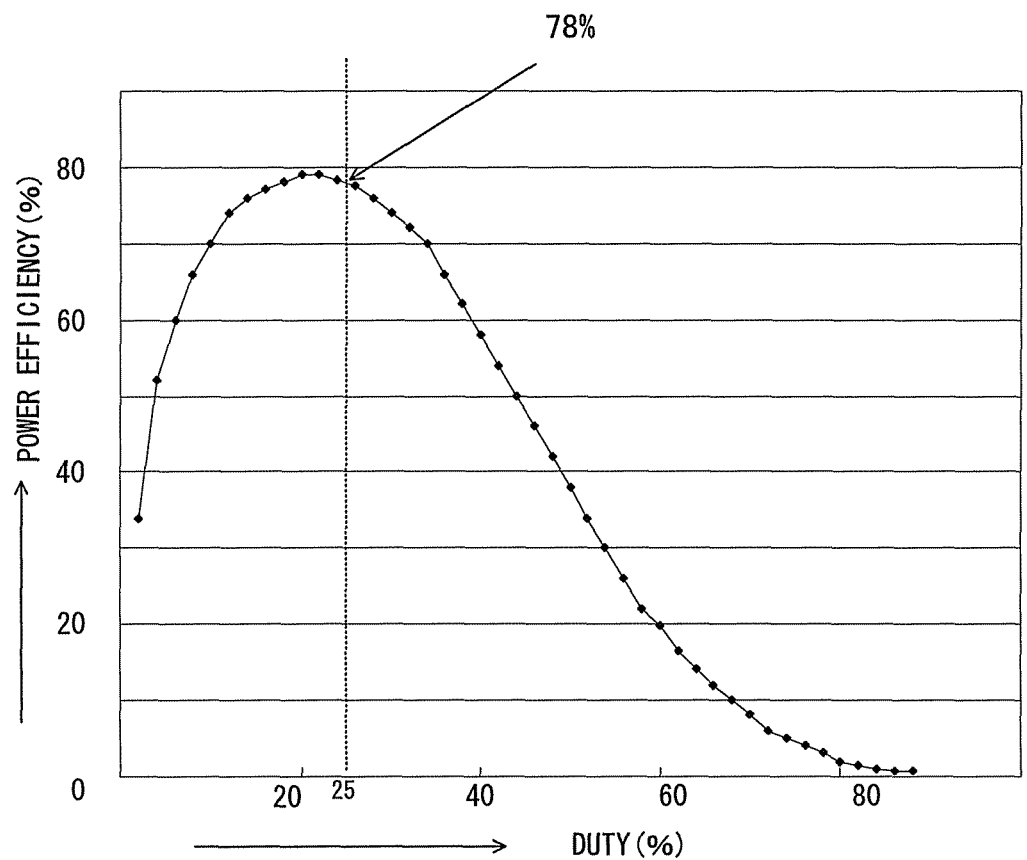
FIG. 7 is a view showing the relationship of the efficiency of the power amplifier according to the first embodiment to duty cycle.

FIG. 7 is a view showing the relationship of the power efficiency of the power amplifier at 900 MHz to duty cycle. As shown in FIG. 7, the power efficiency of the class E power amplifier 11 depends on the duty cycle of the signal S3, which is a logic signal. Specifically, the power efficiency increases in a region in which the duty cycle is 0 to approximately 20%, and the power efficiency gradually decreases in a region in which the duty cycle is not less than approximately 20%. In the embodiment, the duty cycle of the signal S3, which is a logic signal, is set to 25%, and the class E power amplifier 11 operates with a power efficiency of 78% at 900 MHz.

Figure 8:
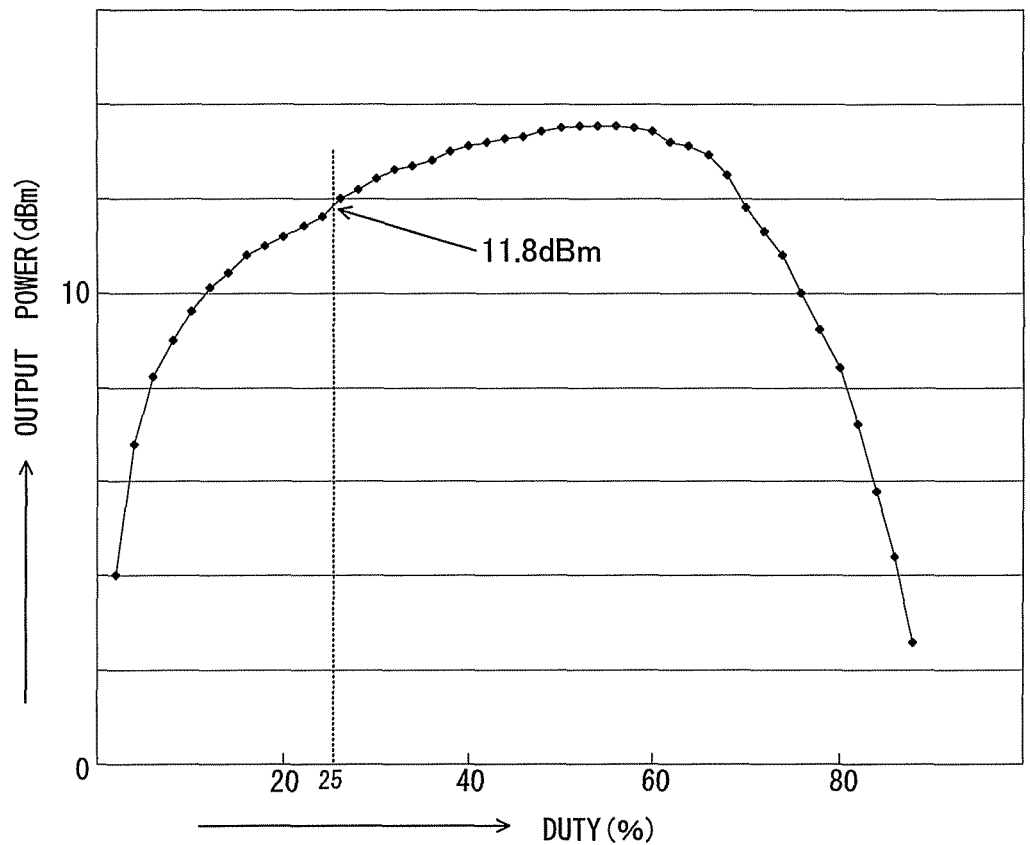
FIG. 8 is a view showing the relationship of the output power of the power amplifier according to the first embodiment to duty cycle.

FIG. 8 is a view showing the relationship of the output power of the power amplifier at 900 MHz to duty cycle. As shown in FIG. 8, the output power of the class E power amplifier 11 depends on the duty cycle of the signal S3, which is a logic signal. Specifically, the output power gradually increases in a region in which the duty cycle is 0 to approximately 55%, and the output power decreases in a region in which the duty cycle is not less than approximately 55%. In the embodiment, the duty cycle of the signal S3, which is a logic signal, is set to 25%, and the class E power amplifier 11 operates with an output power of 11.8 dBm at 900 MHz.

Figure 14:
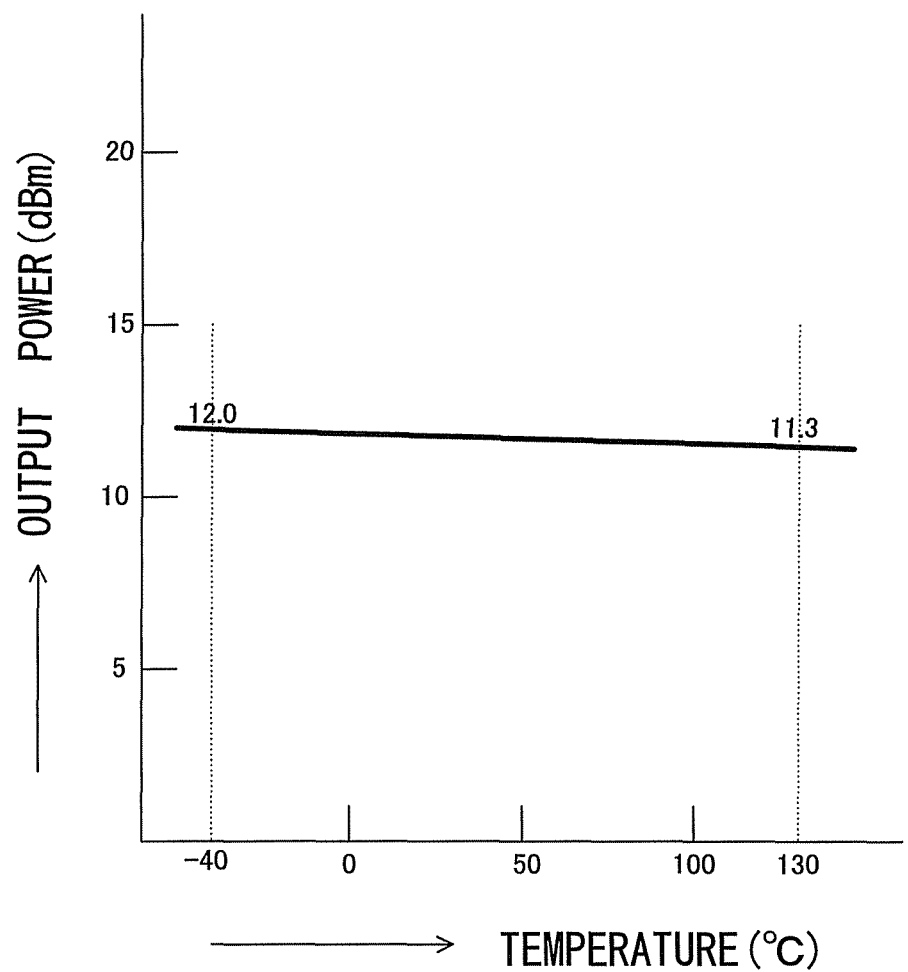
FIG. 14 is a view showing temperature characteristics of output power according to an embodiment.
Figure 15:
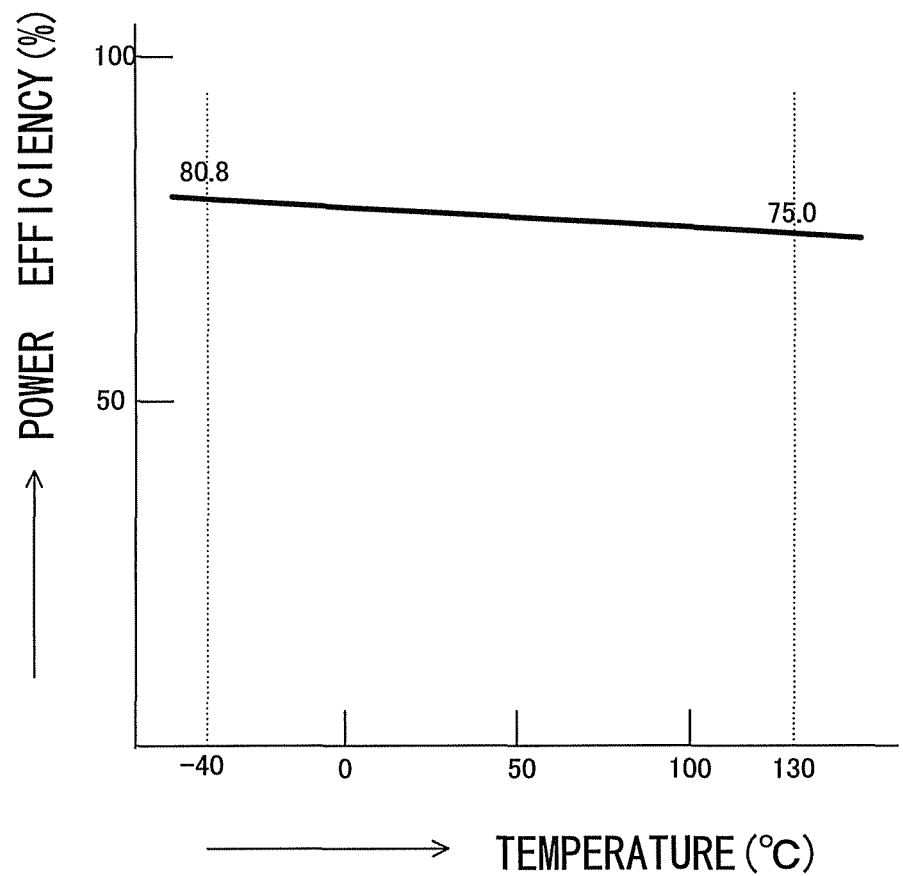
FIG. 15 is a view showing temperature characteristics of efficiency according to an embodiment.

FIG. 14 is a view showing temperature characteristics of the output power. As shown in FIG. 14, the output power changes little with temperature. FIG. 15 is a view showing temperature characteristics of the power efficiency. As shown in FIG. 15, the power efficiency changes little with temperature. In the embodiment, since the signal S3 with a constant duty cycle, which changes very little with temperature, can be obtained, the output power and the power efficiency show small temperature dependences, and have favorable values as shown in FIGS. 14 and 15. This makes it possible to omit a temperature compensating circuit and the like, which have been necessary heretofore, and therefore makes it possible to achieve a reduction in circuit size and an improvement in circuit reliability.

As described above, in the transmitter of the embodiment, the local oscillation signal Slo1 and the local oscillation signal Slo2 having a 90° (λ/4) phase delay with respect to the local oscillation signal Slo1, which are supplied to the mixer 22 of the reception system, are also supplied to the transmission system. The buffer 13 converts the local oscillation signal Slo1 to the signal S1, which is a rectangular wave signal. The buffer 14 converts the local oscillation signal Slo2 to the signal S2, which is a rectangular wave signal. The two-input AND circuit 12 performs logical operation processing on the signals S1, S2 to generate the signal S3, which is a logic signal with a duty cycle of 25%. The power amplifier 11 performs class E amplification operation based on the signal S3 to generate the output signal Sout.

Accordingly, the transmitter having the power amplifier 11 with high efficiency and high reliability can be provided.

It should be noted that though in the embodiment, the transmitter including the power amplifier 11, the two-input AND circuit 12, and the buffers 13, 14 is applied to an RF transceiver, the invention is not necessarily limited to this. The transmitter can be applied to a transmitter for a portable base station, a transmitter for a satellite communication terminal, a transmitter for an audio HiFi system, and the like, for example.

Figure 9:
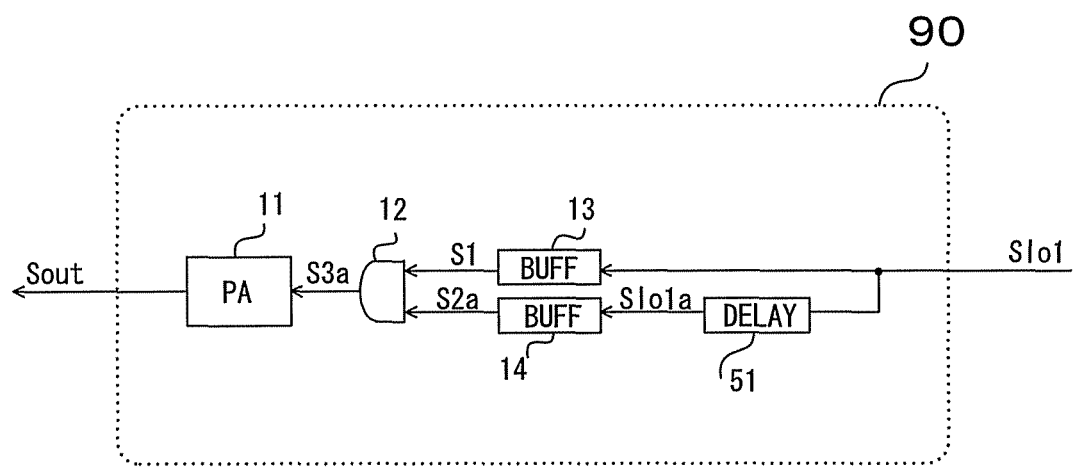
FIG. 9 is a block diagram showing a transmitter according to a second embodiment.

A transmitter according to a second embodiment of the invention will be described with reference to the drawings. FIG. 9 is a block diagram showing the transmitter. The embodiment employs a structure in which the duty cycle of a logic signal inputted to a power amplifier can be changed.

Hereinafter, the same portions as those of the first embodiment are denoted by the same reference numerals, and will not be further described. Only different portions will be described.

As shown in FIG. 9, a transmitter 90 includes the power amplifier 11, the two-input AND circuit 12, the buffers 13, 14, and a delay circuit 51. The transmitter 90 is applied to an RF transceiver, a transmitter for a portable base station, a transmitter for a satellite communication terminal, a transmitter for an audio HiFi system, or the like.

The delay circuit 51 receives the local oscillation signal Slo1, which is generated by a voltage controlled oscillator, for example, generates a delayed signal Slo1a having a phase delay of (λ/n, where n>0) with respect to the local oscillation signal Slo1, and outputs the delayed signal Slo1a to the buffer 14. The delay circuit 51 is constructed using an RC delay circuit, for example, and has a structure in which a predetermined delay value can be selected from a plurality of delay values based on instructions of an unillustrated control signal.

The buffer 13 receives the local oscillation signal Slo1, which is a sinusoidal signal, converts the local oscillation signal Slo1 to the signal S1, which is a rectangular wave signal, and outputs the signal S1 to the two-input AND circuit 12. The buffer 14 receives the delayed signal Slo1a, which is a sinusoidal signal, converts the delayed signal Slo1a to a signal S2a, which is a rectangular wave signal, and outputs the signal S2a to the two-input AND circuit 12.

The two-input AND circuit 12 receives the signals S1, S2a, performs logical operation processing on the signals S1, S2a to generate a signal S3a, which is a logic signal with a predetermined duty cycle, and outputs the signal S3a to the power amplifier 11. The duty cycle of the signal S3a is changed based on a delay value selected in the delay circuit 51.

The class E power amplifier 11 receives the signal S3a, performs amplification operation based on the signal S3a, and outputs the output signal Sout. The class E power amplifier 11 has a structure in which the power efficiency and output power of the class E power amplifier 11 can be changed based on the duty cycle value.

Figure 10:
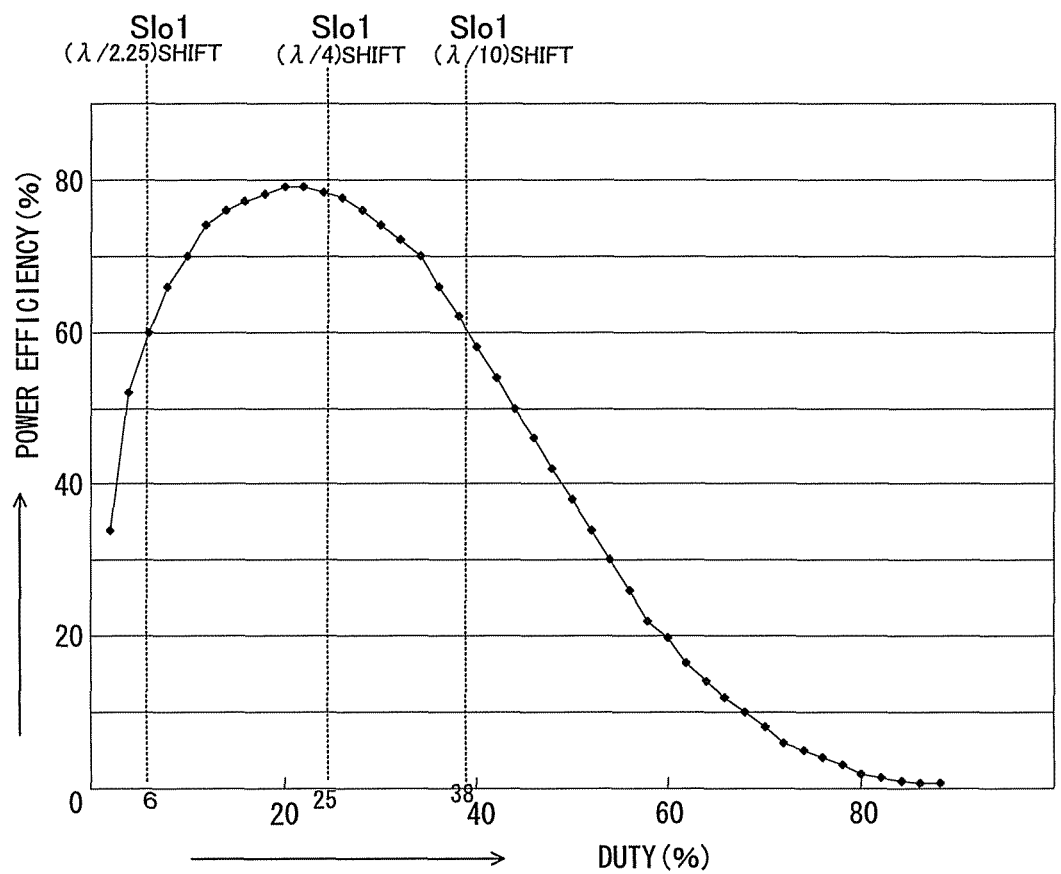
FIG. 10 is a view showing the relationship of the efficiency of a power amplifier according to the second embodiment to duty cycle.

Next, characteristics and operations of the class E amplifier will be described with reference to FIG. 10. FIG. 10 is a view showing the relationship of the power efficiency of the power amplifier at 900 MHz to duty cycle.

High power efficiency and high reliability are required of the class E power amplifier 11. A region of the duty cycle of the signal S3a, which is a logic signal, where the power efficiency can be set not less than 60%, for example, is considered.

As shown in FIG. 10, in the class E power amplifier 11, the power efficiency is not less than 60% in a region in which the duty cycle of the signal S3a is 6 to 38%. The duty cycle of the signal S3a can be set to 6% by delaying the local oscillation signal Slo1 by a phase delay of ($\lambda$/2.25) with the delay circuit 51. The duty cycle of the signal S3a can be set to 38% by delaying the local oscillation signal Slo1 by a phase delay of ($\lambda$/10) with the delay circuit 51. That is to say, the value of n in ($\lambda$/n) is set in the range of not less than 2.25 nor more than 10.

To set the power efficiency of the class E power amplifier 11 not less than 60% and to make the reliability of the class E power amplifier 11 higher than that of the first embodiment, the value of the duty cycle of the signal S3a is favorably set in the range of 6% to less than 25%. The value of n in ($\lambda$/n) is set in the range of 2.25 to less than 4.

It should be noted that the output power when the value of the duty cycle of the signal S3a is 6% is 8.2 dBm at 900 MHz, and that the output power when the value of the duty cycle of the signal S3a is 38% is 13 dBm at 900 MHz.

As described above, in the transmitter of the embodiment, the delay circuit 51 generates the delayed signal Slo1a having a phase delay of ($\lambda$/n, where n>0) with respect to the local oscillation signal Slo1, and outputs the delayed signal Slo1a to the buffer 14. The buffer 13 converts the local oscillation signal Slo1 to the signal S1, which is a rectangular wave signal. The buffer 14 converts the delayed signal Slo1a to the signal S2a, which is a rectangular wave signal. The two-input AND circuit 12 performs logical operation processing on the signals S1, S2a to generate the signal S3a, which is a logic signal with a predetermined duty cycle. The predetermined duty cycle value can be changed with the delay circuit 51. The power amplifier 11 performs class E amplification operation based on the signal S3a to generate the output signal Sout.

Accordingly, the transmitter 90 having the power amplifier 11 with high efficiency and high reliability can be provided. Moreover, the reliability of the power amplifier 11 can be made higher than that of the first embodiment by selecting the delay value of the delay circuit 51.

Figure 11:
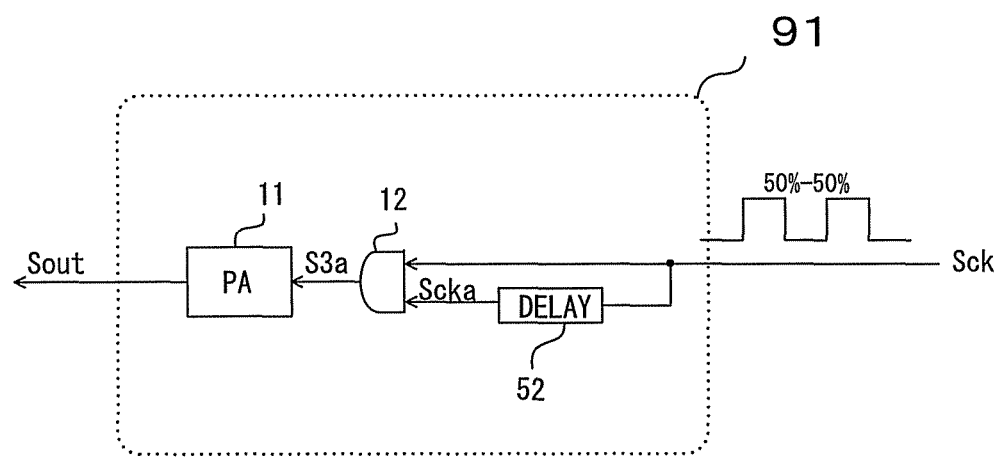
FIG. 11 is a block diagram showing a transmitter according to a third embodiment.
Figure 12:
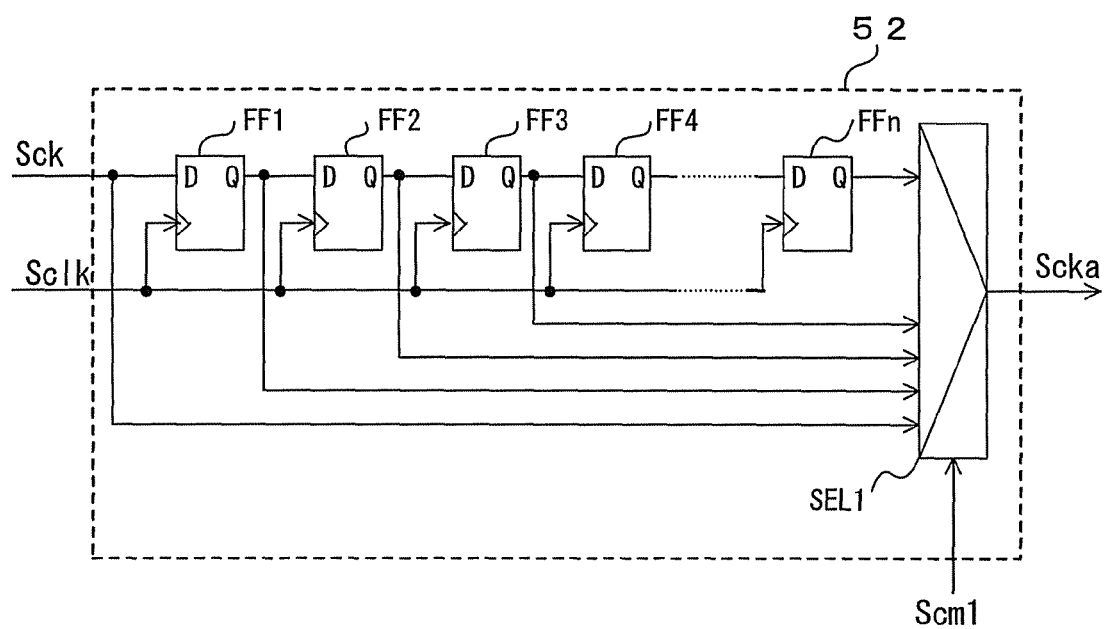
FIG. 12 is a block diagram showing a delay circuit according to the third embodiment.

A transmitter according to a third embodiment of the invention will be described with reference to the drawings. FIG. 11 is a block diagram showing the transmitter. FIG. 12 is a block diagram showing a delay circuit. The embodiment employs a structure in which the duty cycle of a logic signal inputted to a power amplifier can be changed.

Hereinafter, the same portions as those of the first embodiment are denoted by the same reference numerals, and will not be further described. Only different portions will be described.

As shown in FIG. 11, a transmitter 91 includes the power amplifier 11, the two-input AND circuit 12, and a delay circuit 52. The transmitter 91 is applied to an RF transceiver, a transmitter for a portable base station, a transmitter for a satellite communication terminal, a transmitter for an audio HiFi system, or the like.

The delay circuit 52 receives a signal Sck, which is a rectangular wave signal containing 50% high level intervals and 50% low level intervals, generates a delayed signal Scka having a phase delay of ($\lambda$/n, where n>0) with respect to the signal Sck, and outputs the delayed signal Scka to the two-input AND circuit 12.

As shown in FIG. 12, the delay circuit 52 includes n flip-flops (flip-flop FF1, flip-flop FF2, flip-flop FF3, flip-flop FF4, . . . , flip-flop FFn) connected in series and a selector SEL1.

The flip-flop FF1 receives the signal Sck at a D port of the flip-flop FF1, latches the signal Sck at a rising edge of a clock signal Sac, and outputs the latched signal from a Q port of the flip-flop FF1 to the flip-flop FF2 and the selector SEL1. The flip-flop FF2 receives the signal outputted from the flip-flop FF1 at a D port of the flip-flop FF2, latches the signal at a rising edge of the clock signal Sclk, and outputs the latched signal from a Q port of the flip-flop FF2 to the flip-flop FF3 and the selector SEL1. The flip-flop FF3 receives the signal outputted from the flip-flop FF2 at a D port of the flip-flop FF3, latches the signal at a rising edge of the clock signal Sclk, and outputs the latched signal from a Q port of the flip-flop FF3 to the flip-flop FF4 and the selector SEL1. The flip-flop FF4 receives the signal outputted from the flip-flop FF3 at a D port of the flip-flop FF4, latches the signal at a rising edge of the clock signal Sclk, and outputs the latched signal from a Q port of the flip-flop FF4 to the flip-flop FF5 (not shown) and the selector SEL1. The flip-flop FFn receives a signal outputted from an unillustrated flip-flop FF(n−1) at a D port of the flip-flop FFn, latches the signal at a rising edge of the clock signal Sclk, and outputs the latched signal from a Q port of the flip-flop FFn to the selector SEL1.

The selector SEL1 receives the signals outputted from the respective Q ports of the flip-flops FF1, FF2, FF3, FF4, . . . , FFn, and selectively outputs the delayed signal Scka obtained by delaying the signal Sck by a predetermined phase based on a selection signal Scm1.

The two-input AND circuit 12 receives the signal Sck and the delayed signal Scka, performs logical operation processing on the signal Sck and the delayed signal Scka to generate the signal S3a, which is a logic signal with a predetermined duty cycle, and outputs the signal S3a to the power amplifier 11. The duty cycle of the signal S3a is changed based on a delay value selected by the delay circuit 52.

The class E power amplifier 11 receives the signal S3a, performs amplification operation based on the signal S3a, and outputs the output signal Sout. The class E power amplifier 11 has a structure in which the power efficiency and output power of the class E power amplifier 11 can be changed abased on the duty cycle value.

As described above, in the transmitter of the embodiment, the delay circuit 52 generates the delayed signal Scka having a phase delay of ($\lambda$/n, where n>0) with respect to the rectangular wave Sck, and outputs the delayed signal Scka to the two-input AND circuit 12. The two-input AND circuit 12 performs logical operation processing on the signal Sck and the delayed signal Scka to generate the signal S3a, which is a logic signal with a predetermined duty cycle. The predetermined duty cycle value can be changed with the delay circuit 52. The power amplifier 11 performs class E amplification operation based on the signal S3a to generate the output signal Sout.

Accordingly, the transmitter 91 having the power amplifier 11 with high efficiency and high reliability can be provided. Moreover, the efficiency of the power amplifier 11 can be made higher than that of the first embodiment by selecting the delay value of the delay circuit 52.

Figure 13:
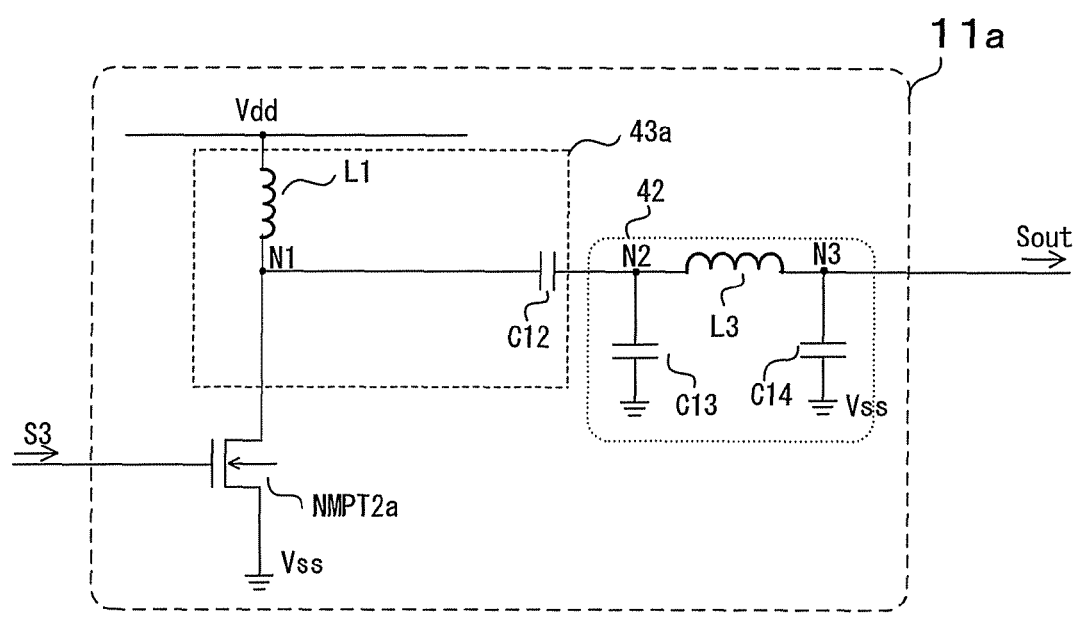
FIG. 13 is a circuit diagram showing a power amplifier according to a fourth embodiment.

A transmitter according to a fourth embodiment of the invention will be described with reference to the drawings. FIG. 13 is a circuit diagram showing a power amplifier. In the embodiment, the configuration of the power amplifier is modified.

Hereinafter, the same portions as those of the first embodiment are denoted by the same reference numerals, and will not be further described. Only different portions will be described.

As shown in FIG. 13, a power amplifier 11*a* includes the filter circuit 42, an output matching circuit 43*a*, and an N-channel MOS transistor NMPT2*a*.

The power amplifier 11*a* is a class E power amplifier. The power amplifier 11*a* is applied to a power amplifier of an RF transceiver, a transmitter for a portable base station, a transmitter for a satellite communication terminal, a transmitter for an audio HiFi system, or the like.

The output matching circuit 43*a* includes the capacitor C12 and the inductor L1. The capacitor C12 has one end connected to the node N1, and has other end connected to the node N2.

The N-channel MOS transistor NMPT2*a* has a drain connected to the node N1, has a gate receiving the signal S3, and has a source connected to the lower voltage source (ground potential) Vss. The N-channel MOS transistor NMPT2*a* is a transistor in the output stage which is turned on or off based on the signal S3.

As described above, in the transmitter of the embodiment, the power amplifier 11*a* includes the filter circuit 42, the output matching circuit 43*a*, and the N-channel MOS transistor NMPT2*a*. The N-channel MOS transistor NMPT2*a*, which is a transistor in the output stage, has a gate receiving the signal S3, which is a logic signal with a duty cycle of 25%. The power amplifier 11*a* performs class E amplification operation.

Accordingly, the transmitter having the power amplifier 11*a* with high efficiency and high reliability can be provided.

The invention is not limited to the above-described embodiments, and various modifications may be made without departing from the spirit of the invention.

In the embodiments, a logic signal with a predetermined duty cycle is generated using a two-input AND circuit, but the invention is not necessarily limited to this. A logic gate other than a two-input AND circuit, a logic circuit, or the like may be used instead. Moreover, a power amplifier is constructed using N-channel MOS transistors, but the invention is not necessarily limited to this. N-channel MIS transistors, MESFETs, HFETs, or the like may be used instead.

Moreover, flip-flops are used in the delay circuit 52 in the third embodiment, but the invention is not necessarily limited to this. Latch circuits, for example, may be used instead.

While certain embodiments have been described, these embodiments have been presented by way of example only, and are not intend to limit the scope of the inventions. Indeed, the novel embodiments described herein may be embodied in a variety of the other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A transceiver comprising:
a voltage controlled oscillator to generate a first sinusoidal signal and a second sinusoidal signal having a phase delay with respect to the first sinusoidal signal;
a mixer to receive the first and second sinusoidal signals;
a first buffer to receive the first sinusoidal signal, the first buffer to conver the first sinusoidal signal to a first rectangular wave signal;
a second buffer to receive the second sinusoidal signal, the second buffer to convert the second sinusoidal signal to a second rectangular wave signal;
a logic circuit to receive the first and second rectangular wave signals, the logic circuit to perform logical operation processing on the first and second rectangular wave signals to generate a logic signal with a predetermined duty cycle; and
a class E power amplifier to receive the logic signal, the class E power amplifier to perform amplification operation based on the logic signal, wherein
the first and second buffers are composed of the same circuit, the first and second buffers include a first capacitor, a first resistor, a first P-channel transistor, a second P-channel transistor, a first N-channel transistor, and a second N-channel transistor,
the first capacitor has one end connected to input sides of the first and second buffers,
the first resistor has one end connected to the other end of the first capacitor,
the first P-channel transistor has a source connected to a higher voltage source, and has a gate connected to the other end of the first capacitor,
the first N-channel transistor a drain connected to a drain of the first P-channel transistor and the other end of the first resistor, has a gate connected to the other end of the first capacitor, and has a source connected to a lower voltage source,
the second P-channel transistor has a source connected to the higher voltage source, has a gate connected to the other end of the first resistor, and has a drain connected to output sides of the first and second buffers,
the second N-channel transistor has a drain connected to a drain of the second P-channel transistor, has a gate connected to the other end of the first resistor, and has a source connected to the lower voltage source.

2. A transceiver comprising:
a voltage controlled oscillator to generate a first sinusoidal signal and a second sinusoidal signal having a phase delay with respect to the first sinusoidal signal;
a mixer to receive the first and second sinusoidal signals;
a first buffer to receive the first sinusoidal signal, the first buffer to conver the first sinusoidal signal to a first rectangular wave signal;
a second buffer to receive the second sinusoidal signal, the second buffer to convert the second sinusoidal signal to a second rectangular wave signal;
a logic circuit to receive the first and second rectangular wave signals, the logic circuit to perform logical operation processing on the first and second rectangular wave signals to generate a logic signal with a predetermined duty cycle; and
a class E power amplifier to receive the logic signal, the class E power amplifier to perform amplification operation based on the logic signal,
the class E power amplifier includes a voltage bias circuit, a filter circuit, a first transistor, a second transistor and an output matching circuit,
the first and second transistors are cascode-connected,
the first transistor has a gate receiving a voltage outputted from the voltage bias circuit, and
the second transistor is provided between the first transistor and a lower voltage source, the second transistor has a gate receiving the logic signal, the second transistor outputs an amplified signal, and wherein the gate length of the second transistor is smaller than that of the first transistor.

3. A transceiver comprising:

a voltage controlled oscillator to generate a first sinusoidal signal and a second sinusoidal signal having a phase delay with respect to the first sinusoidal signal;

a mixer to receive the first and second sinusoidal signals;

a first buffer to receive the first sinusoidal signal, the first buffer to conver the first sinusoidal signal to a first rectangular wave signal;

a second buffer to receive the second sinusoidal signal, the second buffer to convert the second sinusoidal signal to a second rectangular wave signal;

a logic circuit to receive the first and second rectangular wave signals, the logic circuit to perform logical operation processing on the first and second rectangular wave signals to generate a logic signal with a predetermined duty cycle; and a class E power amplifier to receive the logic signal, the class E power amplifier to perform amplification operation based on the logic signal, wherein the first and second buffers are composed of the same circuit, the first and second buffers include a first capacitor, a first resistor, a first P-channel transistor, a second P-channel transistor, a first N-channel transistor, and a second N-channel transistor, the first capacitor has one end connected to input sides of the first and second buffers, the first resistor has one end connected to the other end of the first capacitor, the first P-channel transistor has a source connected to a higher voltage source, and has a gate connected to the other end of the first capacitor, the first N-channel transistor a drain connected to a drain of the first P-channel transistor and the other end of the first resistor, has a gate connected to the other end of the first capacitor, and has a source connected to a lower voltage source, the second P-channel transistor has a source connected to the higher voltage source, has a gate connected to the other end of the first resistor, and has a drain connected to output sides of the first and second buffers, the second N-channel transistor has a drain connected to a drain of the second P-channel transistor, has a gate connected to the other end of the first resistor, and has a source connected to the lower voltage source.

4. A transceiver comprising: a voltage controlled oscillator to generate a first sinusoidal signal and a second sinusoidal signal having a phase delay with respect to the first sinusoidal signal;

a mixer to receive the first and second sinusoidal signals;

a first buffer to receive the first sinusoidal signal, the first buffer to convert the first sinusoidal signal to a first rectangular wave signal;

a second buffer to receive the second sinusoidal signal, the second buffer to convert the second sinusoidal signal to a second rectangular wave signal;

a logic circuit to receive the first and second rectangular wave signals, the logic circuit to perform logical operation processing on the first and second rectangular wave signals to generate a logic signal with a predetermined duty cycle; and a class E power amplifier to receive the logic signal, the class E power amplifier to perform amplification operation based on the logic signal, the class E power amplifier includes a voltage bias circuit, a filter circuit, a first transistor, a second transistor and an output matching circuit, the first and second transistors are cascode-connected, the first transistor has a gate receiving a voltage outputted from the voltage bias circuit, and the second transistor is provided between the first transistor and a lower voltage source, the second transistor has a gate receiving the logic signal, the second transistor outputs an amplified signal, and wherein the gate length of the second transistor is smaller than that of the first transistor.

* * * * *